United States Patent
Sasada et al.

[11] Patent Number: 5,936,300
[45] Date of Patent: Aug. 10, 1999

[54] SEMICONDUCTOR DEVICE WITH FILM COVERING

[75] Inventors: Kazuhiro Sasada, Hashima; Mamoru Arimoto, Ogaki; Hideharu Nagasawa, Takatsuki; Atsuhiro Nishida, Ogaki; Hiroyuki Aoe, Joyo; Yosifumi Matusita, Bisai, all of Japan

[73] Assignee: Sanyo Electric Co., Ltd., Osaka, Japan

[21] Appl. No.: 08/826,314

[22] Filed: Mar. 24, 1997

[30]  Foreign Application Priority Data

Mar. 25, 1996 [JP] Japan .................................... 8-068064
Jan. 24, 1997 [JP] Japan .................................... 9-011446

[51] Int. Cl.⁶ .................................................. H01L 23/58
[52] U.S. Cl. .......................... 257/632; 257/640; 257/641; 257/649; 438/791
[58] Field of Search .................................. 257/649, 640, 257/632, 641; 438/791

[56] References Cited

U.S. PATENT DOCUMENTS

| | | | |
|---|---|---|---|
| 5,130,772 | 7/1992 | Choi | 357/23.7 |
| 5,440,168 | 8/1995 | Nishimura et al. | 257/640 |
| 5,561,319 | 10/1996 | Owens et al. | 257/649 |
| 5,652,459 | 7/1997 | Chen | 257/529 |
| 5,731,238 | 3/1998 | Cavins et al. | 438/261 |
| 5,747,866 | 5/1998 | Ho et al. | 257/506 |

FOREIGN PATENT DOCUMENTS

| | | |
|---|---|---|
| 64-34009 | 2/1989 | Japan . |
| 2-311765 | 11/1990 | Japan . |
| 5-296592 | 11/1993 | Japan . |

OTHER PUBLICATIONS

"Improvement of Water–Related Hot–Carrier Reliability by Using ECR Plasma–SiO$_2$" by Machida et al., "Transactions of Electron Devices," IEEE, vol. 41, No. 5, May 1994, pp. 709–714.

"Improvement of Gate Oxide Reliability with LPCVD–SiN" by Uraoka et al. Shingaku Gihou, SDM 88–42, 1988 pp. 13–18, 1988.

*Primary Examiner*—William Mintel
*Attorney, Agent, or Firm*—Sheridan Ross P.C.

[57] ABSTRACT

A pair of source/drain regions are formed on a semiconductor substrate at a predetermined interval. A gate insulator film is formed on the semiconductor substrate between the source/drain regions of the pair. A gate electrode is formed on the gate insulator film. A film for covering the gate electrode and the source/drain regions has a low permeability against water and a hydroxide group, and has a thickness greater than 3 nm and less than 5 nm.

25 Claims, 18 Drawing Sheets

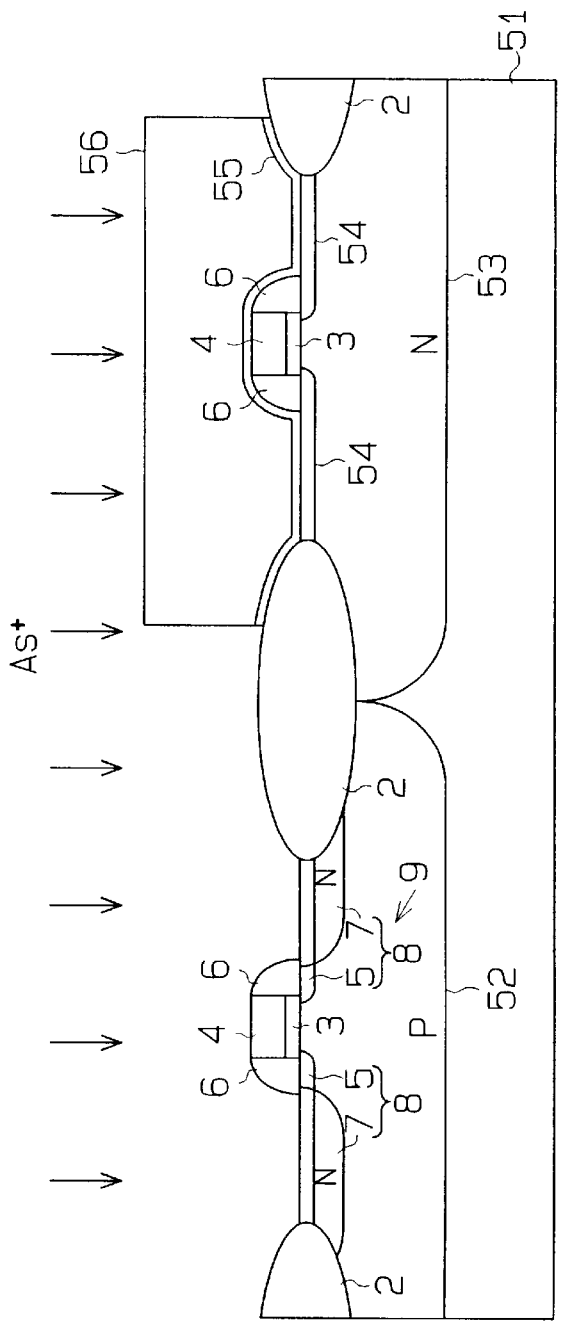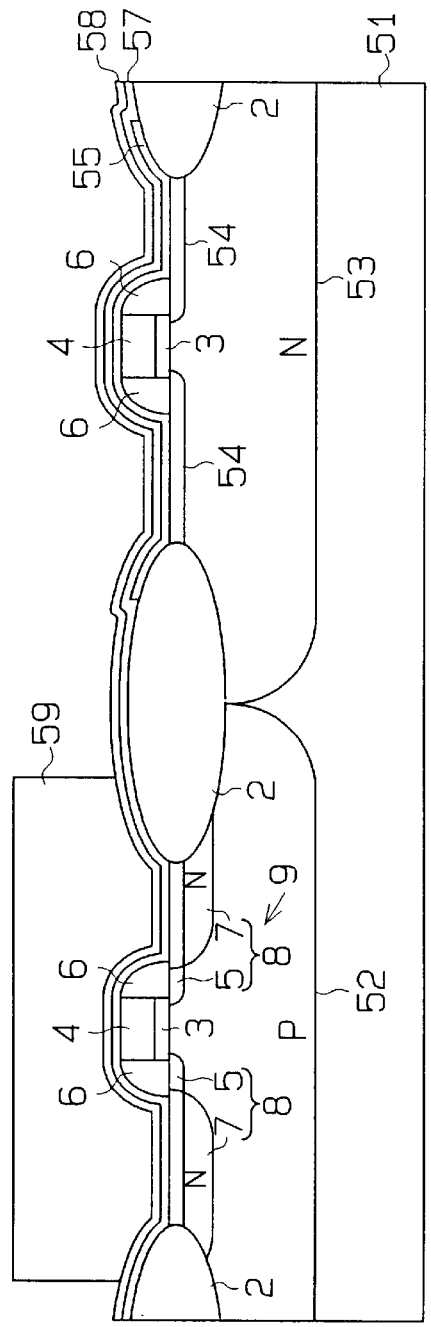
Fig.15 (a)
Fig.15 (b)

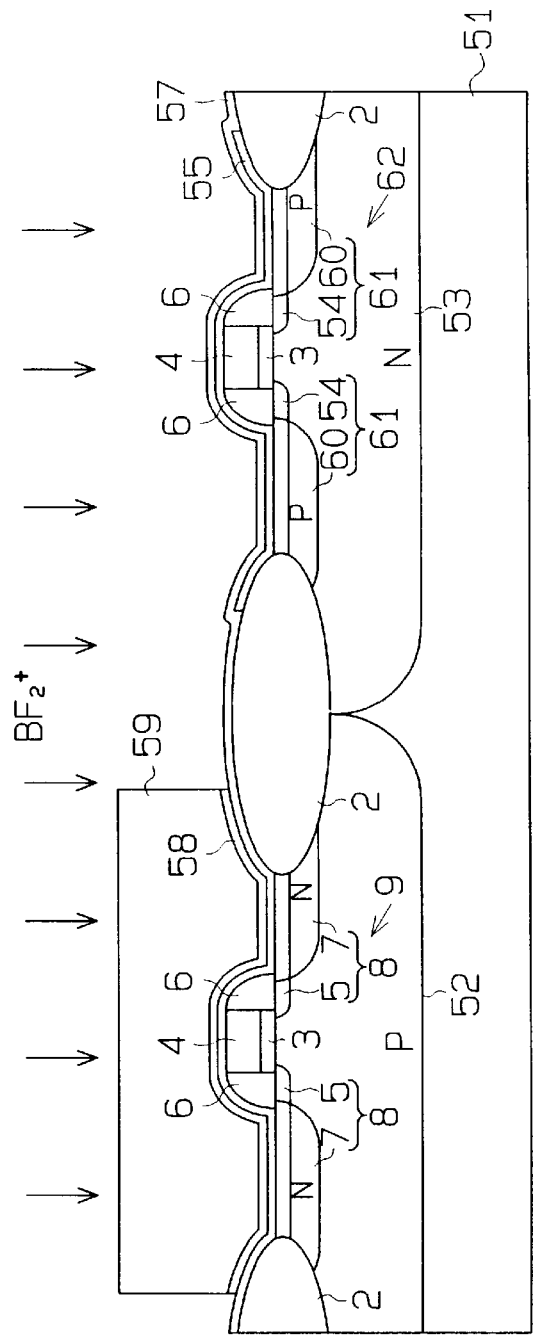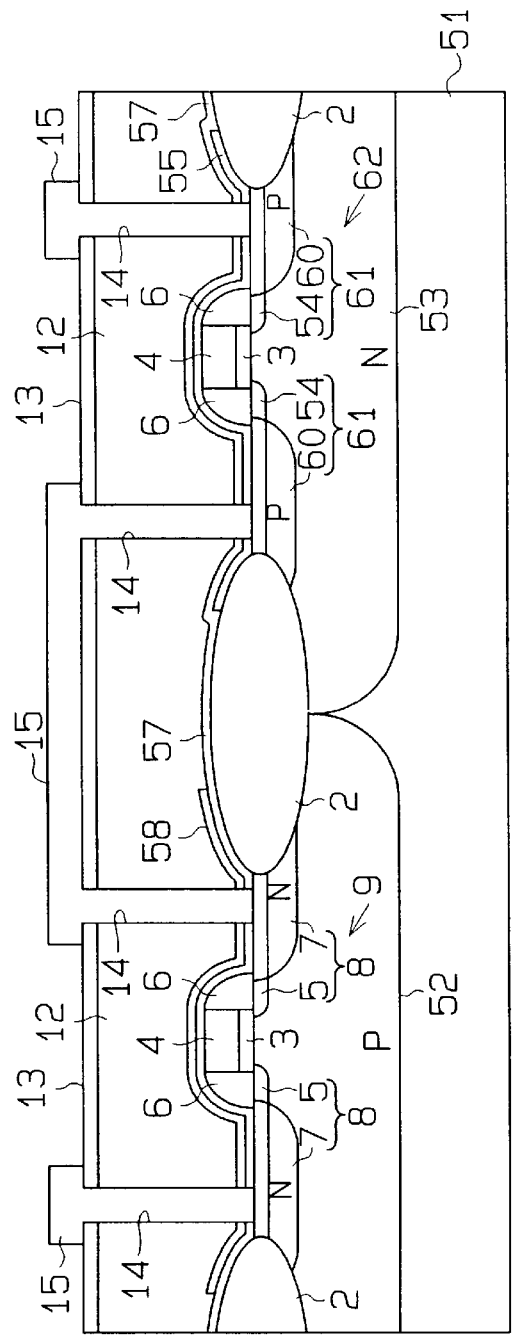
Fig.16 (a)
Fig.16 (b)

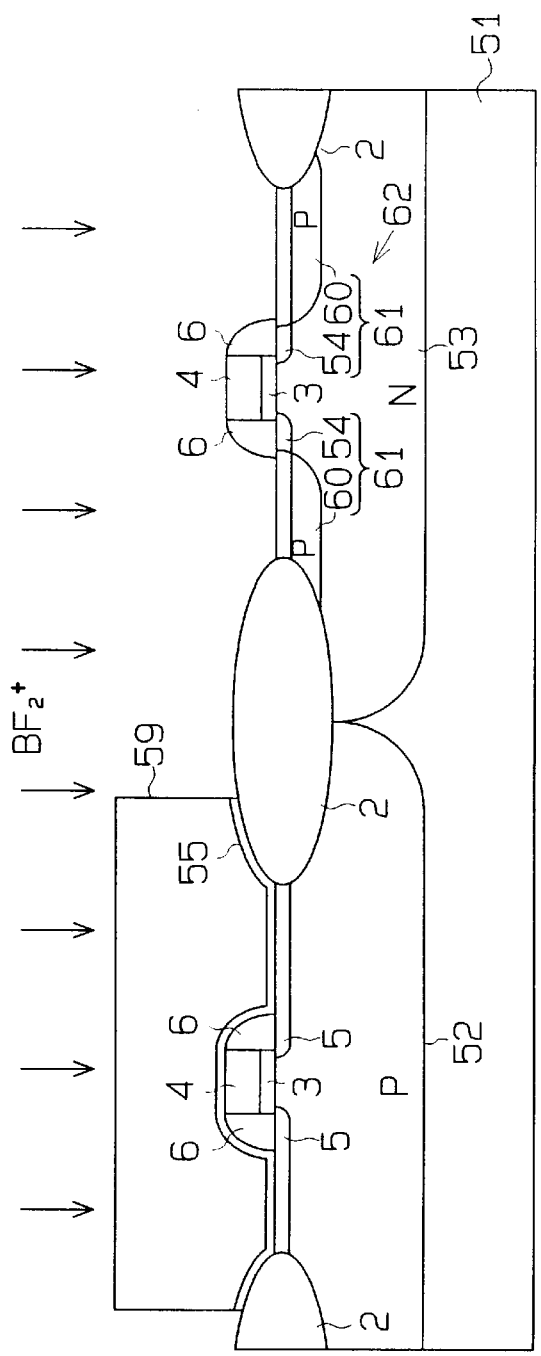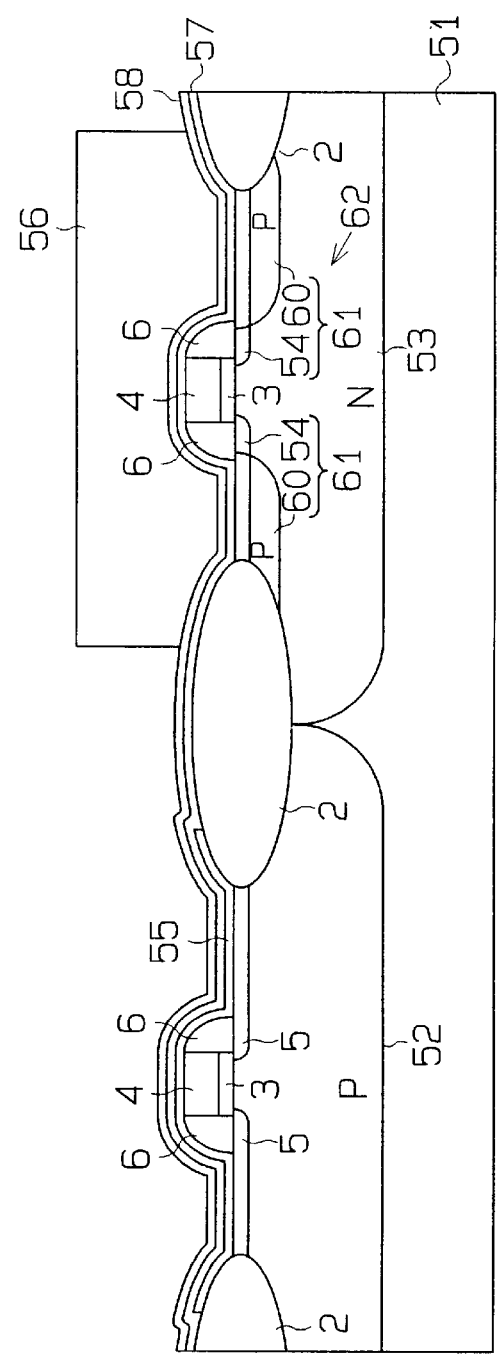

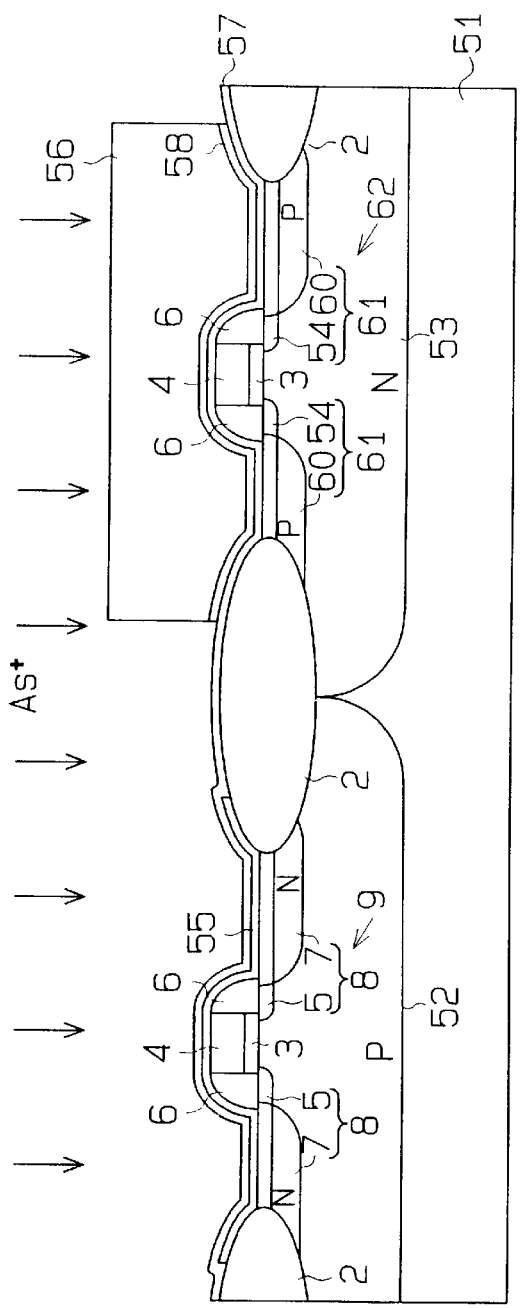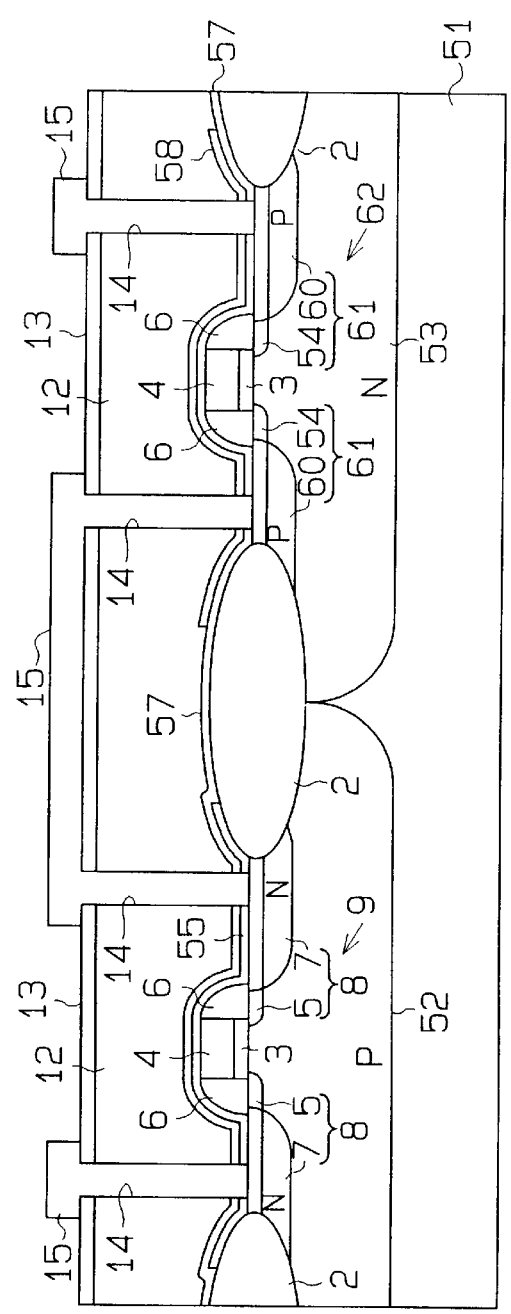
Fig.18 (a)
Fig.18 (b)

SEMICONDUCTOR DEVICE WITH FILM COVERING

BACKGROUND OF THE INVENTION

1. Field of the Invention

The present invention relates to a semiconductor device and a method of fabricating th e same. More particularly, this invention relates to a semiconductor device having a film, which reduces the deterioration of the characteristics of the device caused by water or a hydroxyl group and does not affect the initial characteristics of the device, and a method of fabricating the same.

2. Description of the Related Art

There are two conventional methods to reduce the deterioration of the characteristics of a semiconductor device caused by water or a hydroxyl group.

One way is to cover a device with a PE-TEOS (Plasma Enhanced Tetra-Ethyl-Ortho-Silicate) film formed by plasma CVD (Chemical Vapor Deposition), form a BPSG (Boro-Phospho Silicate Glass) film on the PE-TEOS film and form an insulator film on the BPSG film (see K. Machida et al., "TRANSACTIONS OF ELECTRON DEVICES," IEEE, Vol. 41, No. 5, May 1994, pp. 709–714).

The other way is to cover a device with a silicon nitride film formed by LPCVD (Low Pressure Chemical Vapor Deposition) (see Uraoka et al., Shingaku Gihou, SDM 88-42, 1988, pp. 13–18).

In the Machida et al. process, attention was paid to the prevention of the diffusion of water or hydroxyl group into each device from the insulator film on the BPSG film.

When the BPSG film itself is the supply source of water or a hydroxyl group, therefore, the diffusion of water or hydroxyl group cannot be prevented.

The Uraoka et al. process has a great effect of preventing the permeation of water or a hydroxyl group. When a silicon nitride film is formed on an MOSFET (Metal Oxide Semiconductor Field Effect Transistor), however, an increase occurs in the initial short-channel effect or the reliability of the MOSFET. When a silicon nitride film is not formed on the MOSFET, the BT (Bias Temperature) instability increases.

SUMMARY OF THE INVENTION

Accordingly, it is a primary objective of the present invention to provide a semiconductor device having a film, which reduces the deterioration of the characteristics of the device caused by water or a hydroxyl group and does not affect the initial characteristics of the device, and a method of fabricating the same.

To achieve this object, a semiconductor device according to the first aspect of this invention comprises a semiconductor substrate, a transistor device formed on the semiconductor substrate and a silicon nitride film having a thickness of 3 nm or greater and less than 5 nm and covering the transistor device.

A semiconductor device according to the second aspect of this invention has a pair of source/drain regions formed on a semiconductor substrate at a predetermined interval. A gate insulator film is formed on the semiconductor substrate between the pair of source/drain regions. A gate electrode is formed on the gate insulator film. A film for covering the gate electrode and the source/drain regions has a low permeability against water and a hydroxyl group and has a thickness greater than 3 nm but less than 5 nm.

A method of fabricating a semiconductor device according to the third aspect of this invention comprises the steps of:

forming gate insulator films on first and second conductive wells formed on a semiconductor substrate;

forming gate electrodes on the gate insulator films, respectively;

forming a first silicon nitride film on entire surfaces of the first and second conductive wells including the gate electrodes;

forming a first mask on the well of the second conductivity including the associated gate electrode;

patterning the first silicon nitride film into lands with the first mask used as an etching mask;

injecting ions of an impurity of the second conductivity into the well of the first conductivity with the first mask used as an ion injection mask, thereby forming a source/drain region of an insulating gate FET on the first conductive well;

forming a film having an etching rate different from that of the first silicon nitride film, on the entire surfaces of the wells of the first and second conductivities including the respective gate electrodes;

forming a second silicon nitride film on the film having an etching rate different from that of the first silicon nitride film;

forming a second mask on the first conductive well including the associated gate electrode;

patterning a second silicon nitride film into lands with the second mask used as an etching mask; and injecting ions of an impurity of the first conductivity into the second conductive well with the second mask used as an ion injection mask, thereby forming a source/drain region of the insulating gate FET on the second conductive well.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 14(a) and 14(b), FIGS. 15(a) and 15(b), and FIGS. 16(a) and 16(b) are schematic cross-sectional views for explaining the fabricating steps of the fifth embodiment; and FIGS. 17(a) and 17(b), and FIGS. 18(a) and 18(b) are schematic cross-sectional views for explaining the fabricating steps of the sixth embodiment.

DETAILED DESCRIPTION OF THE PREFERRED EMBODIMENTS

Figure 1:
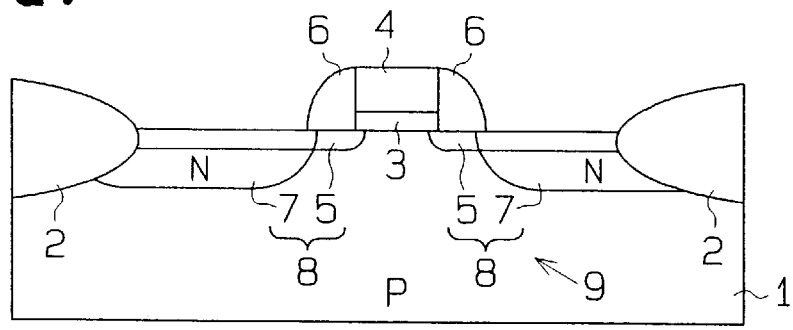
FIGS. 1(a) through 1(c) and FIGS. 2(a) through 2(c) are schematic cross-sectional views for explaining the fabricating steps of the first embodiment.
Figure 1:
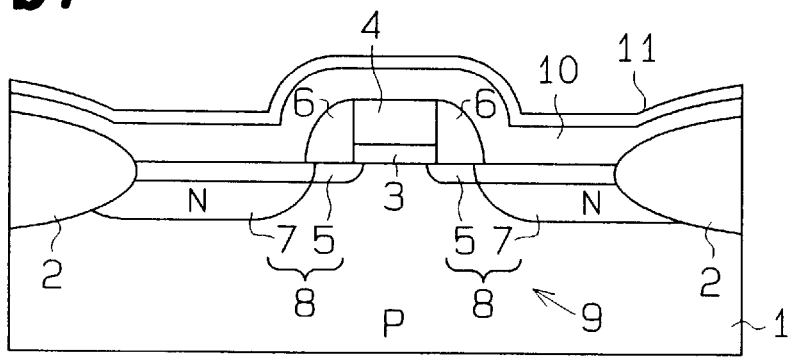
Figure 1:
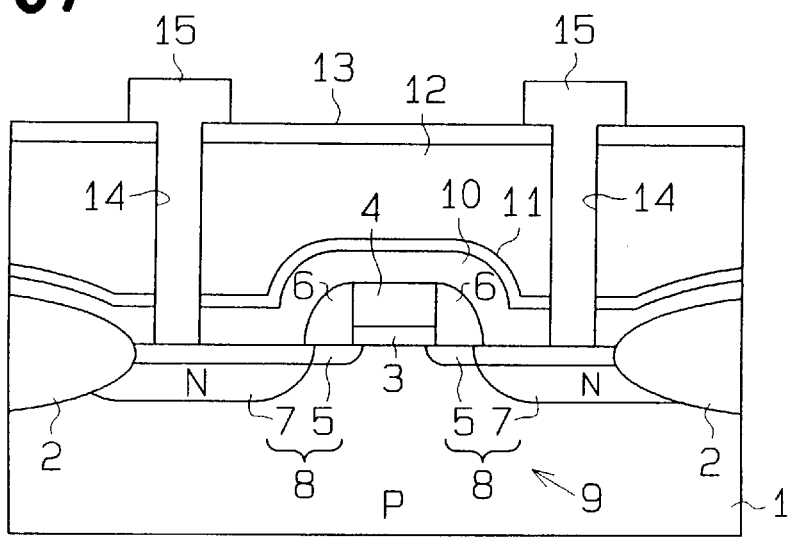

The first embodiment of the present invention as adapted to an NMOSFET will now be described with reference to the accompanying drawings.

In step 1 (see FIG. 1(a)) in the fabrication method for an NMOSFET according to this embodiment, LOCOS (Local Oxidation on Silicon) is used to form a device isolating insulator film 2 on a P type single crystalline silicon substrate 1. As a result, the surface of the substrate 1, which is exposed from the device isolating insulator film 2, serves as an active region. Next, thermal oxidation is used to form a gate oxide film 3 (film thickness: 11 nm) on the substrate 1. Subsequently, a doped polysilicon film added with an N type impurity is formed on the gate oxide film 3 and is then patterned to form a gate electrode 4.

Then, with the gate electrode 4 used as an ion injection mask, phosphorus ions are injected into the surface of the substrate 1 (injection energy: 50 keV) to form an impurity region 5 of a low concentration. Next, a silicon oxide film is formed on the entire surface of the device by CVD. This silicon oxide film is etched back using the full surface etch-back, thus forming side wall spacers 6 (width: 150 nm) on both sides of the gate electrode 4.

With the gate electrode 4 and the side wall spacers 6 used as ion injection masks, arsenic ions are injected into the surface of the substrate 1 (injection energy: 35 keV), thus forming an impurity region 7 of a high concentration. Then, annealing (treatment temperature: 900° C.) is performed to activate the individual impurity regions 5 and 7. As a result, a silicon gate NMOSFET 9 having an LDD (Lightly Doped Drain) structure, which has a source/drain region 8 comprised of the low-concentration impurity region 5 and the high-concentration impurity region 7, is formed.

In step 2 (see FIG. 1(b)), a TEOS film 10 (film thickness: 200 nm) is formed on the entire surface of the resultant device obtained through the above step. Next, a silicon nitride film 11 (film thickness: less than 10 nm) is formed on the TEOS film 10 by LPCVD. In this case, a material gas is a ($SiH_2Cl_2+NH_3$)-based gas, and the film forming temperature is 700 to 900° C., preferably 700 to 750° C.

In step 3 (see FIG. 1(c)), a BPSG film 12 (film thickness: 500 to 1000 nm) is formed on the silicon nitride film 11 by CVD. Since the BPSG film has an excellent flatness, it is possible to flatten the device surface. Next, a silicon oxide film 13 (film thickness: 100 nm) is formed on the BPSG film 12 by CVD. Subsequently, a contact hole 14 is formed in the individual films 10 to 13. A metal film is formed on the entire surface of the device including the inner wall of the contact hole 14, and this metal film is then patterned to form a source/drain electrode 15.

FIGS. 2(a) to 2(c) illustrate the steps of fabricating a PMOSFET. To avoid a redundant description, like or same reference numerals are given to those constituents that are like or the same as those in the fabrication method for the NMOSFET illustrated in FIGS. 1(a)–(c).

In step 1 (see FIG. 2(a)), a device isolating insulator film 2 is formed on an N type single crystalline silicon substrate 21. As a result, the surface of the substrate 21 that is exposed from the device isolating insulator film 2 serves as an active region. Next, thermal oxidation is used to form a gate oxide film 3 on the substrate 21. Subsequently, a gate electrode 4 is formed on the gate oxide film 3. Then, with the gate electrode 4 used as an ion injection mask, boron fluoride ($BF_2$) ions are injected into the surface of the substrate 21 (injection energy: 50 keV) to form an impurity region 22. Subsequently, side wall spacers 6 are formed on both sides of the gate electrode 4. Then, annealing (treatment temperature: 900° C.) is performed to active the impurity region 22. As a result, a silicon gate PMOSFET 24 having an SD (Single Drain) structure, which has a source/drain region 23 comprised of the impurity region 22, is formed.

In step 2 (see FIG. 2(b)), a TEOS film 10 and a silicon nitride film 11 are sequentially formed on the entire surface of the device prepared in the above step.

In step 3 (see FIG. 2(c)), a BPSG film 12 is formed on the silicon nitride film 11, and a silicon oxide film 13 is then formed on the BPSG film 12. Subsequently, a contact hole 14 is formed and a source/drain electrode 15 is formed.

Figure 3:
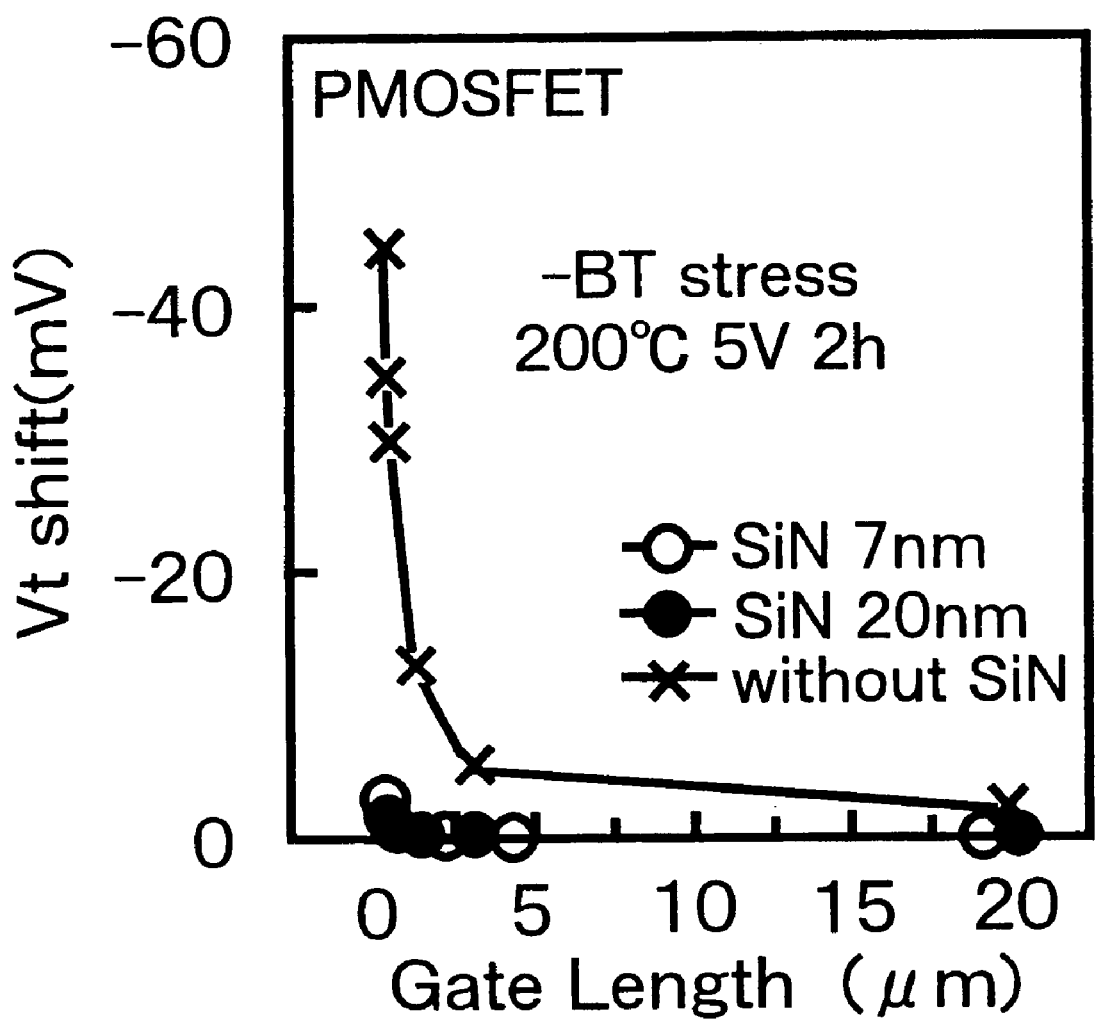
FIG. 3 is a graph showing the BT instability of a PMOSFET.

FIG. 3 is a graph showing the results of checking the BT instability of the PMOSFET 24 using the BT stress technique (BT stress conditions: 200° C., 5 V and 2 hours). When the silicon nitride film 11 (SiN) is not formed, the threshold voltage (Vt) of the PMOSFET 24 is shifted due to the BT stress. When the silicon nitride film 11 is formed, on the other hand, the shifting of the threshold voltage by the BT stress is apparently suppressed to eliminate the influence on the BT instability. Note that with regard to the NMOSFET 9, there is no influence of the silicon nitride film 11 on the BT instability.

It is understood that the mechanism of the BT instability in the PMOSFET 24 follows the following formulae.

Due to the influence of water or a hydroxyl group, a dangling bond is formed between silicon atoms (indicated by Sis) on the substrate (21) side and hydrogen atoms at the interface between the substrate 21 and the gate oxide film 3, as indicated by the formula (1):

$$\equiv Sis-H \rightarrow \equiv Sis^{31} + H \qquad (1).$$

As indicated by the formula (2), a dangling bond is formed in the gate oxide film 3 by the hydrogen atoms produced in accordance with the formula (1):

$$\equiv Sio-O-Sio \equiv +H \rightarrow \equiv Sio-OH+ \equiv Sio^- \equiv Sio^- \rightarrow Sio^+ + e \qquad (2).$$

where "Sio" represents silicon atoms present in the gate oxide film 3 formed of the silicon oxide film. Because of the influence of water or a hydroxyl group, therefore, positive charges ($SiO^+$) are produced in the vicinity of the gate edges or both end portions of the gate oxide film 3.

The formation of the silicon nitride film 11 on the PMOSFET 24 can prevent positive charges from being produced near the gate edges due to the influence of water or a hydroxyl group.

Figure 4:
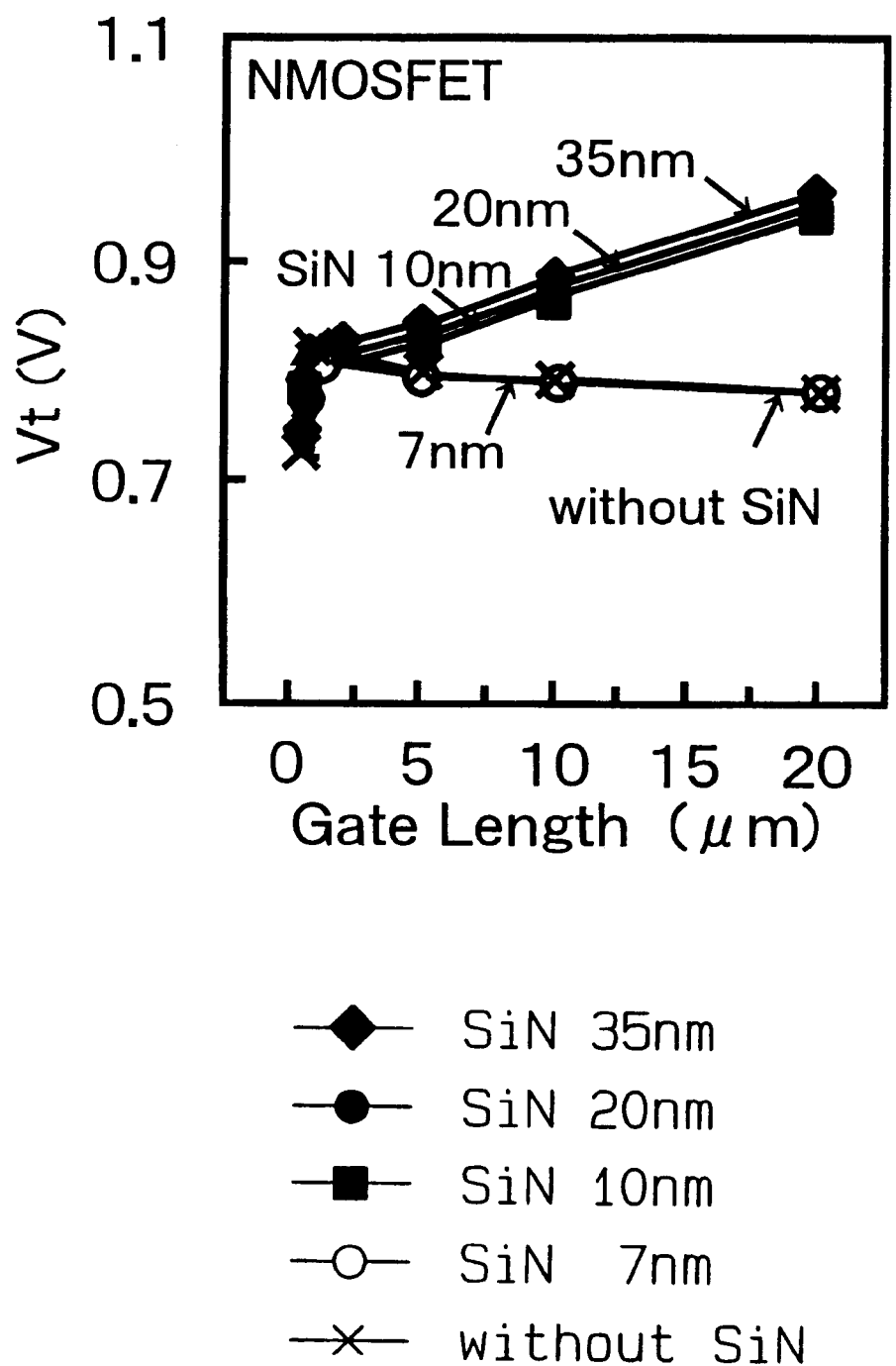
FIG. 4 is a graph showing the initial short-channel effect of an NMOSFET.

FIG. 4 illustrates the results of checking the initial short-channel effect of the NMOSFET 9. When the silicon nitride film 11 is deposited 10 nm thick or thicker, the initial threshold voltage (Vt) increases in the long channel region with a great gate length in the NMOSFET 9. If the thickness of the silicon nitride film 11 is made less than 10 nm, therefore, the influence of the silicon nitride film 11 on the initial short-channel effect is apparently gone. Note that with regard to the PMOSFET 24, there is no influence of the silicon nitride film 11 on the initial short-channel effect.

Figure 5:
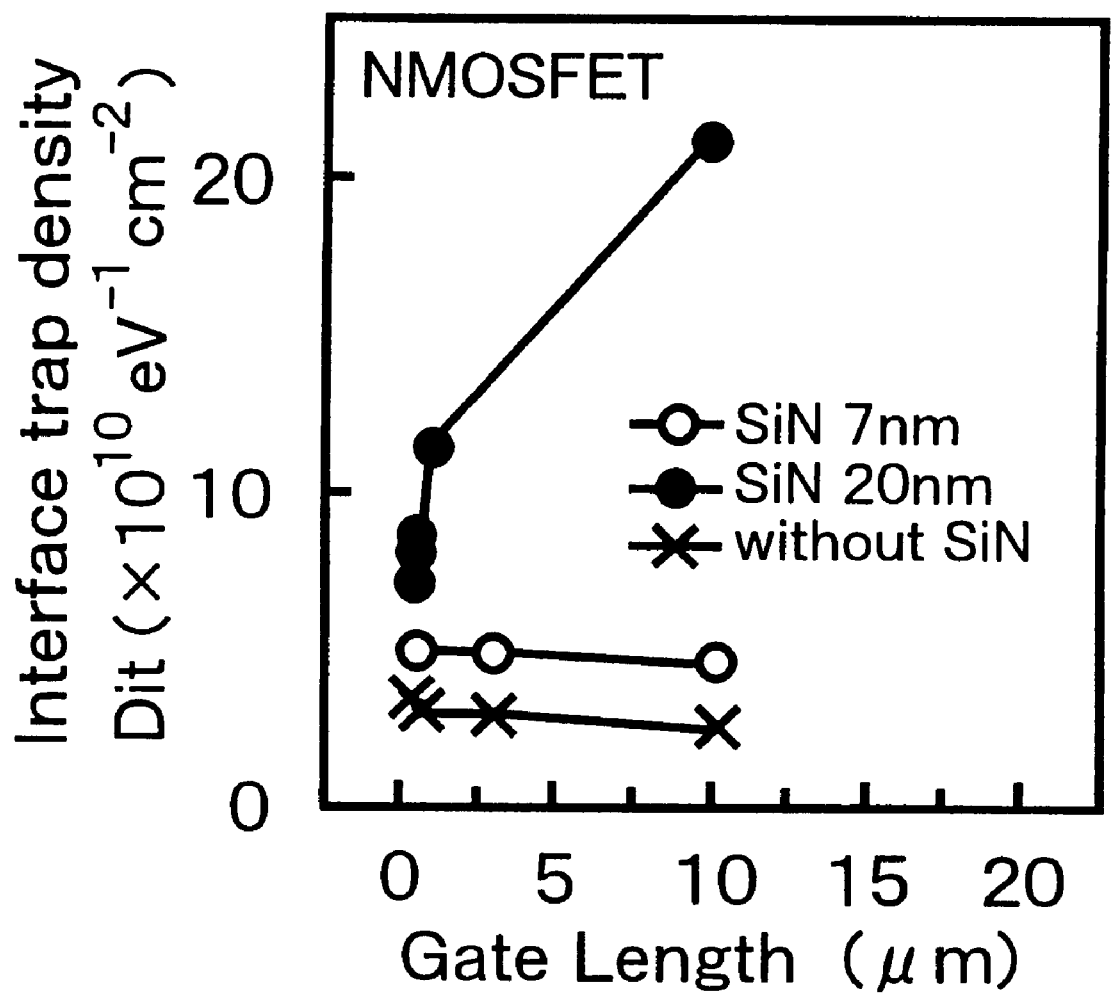
FIG. 5 is a graph showing the gate length dependency of the interface trap density (Dit) between a substrate and a gate oxide film of an NMOSFET.
Figure 6:
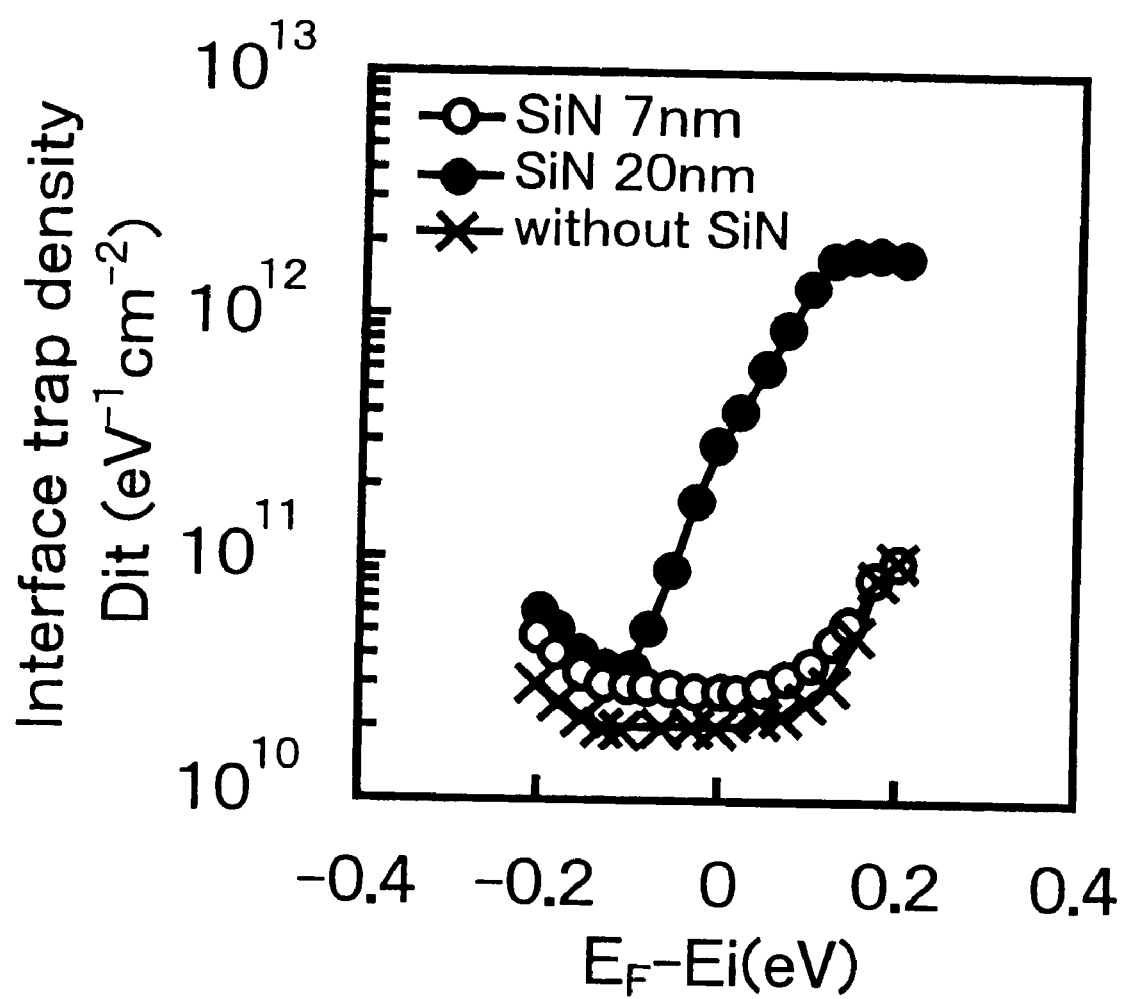
FIG. 6 is a graph showing the energy level dependency of the interface trap density (Dit) of an NMOSFET.

FIG. 5 shows the results of checking the gate length dependency of the interface trap density (Dit) between the substrate 1 and the gate oxide film 3. The graph shows that the gate length dependency of the interface trap density appears when the thickness of the silicon nitride film 11 is 20 nm, but it does not when that thickness is 7 nm. If the thickness of the silicon nitride film 11 is made less than 10 nm, therefore, the gate length dependency of the interface trap density is gone. FIG. 6 shows the results of checking the energy level dependency of the interface trap density (Dit) in the NMOSFET 9 using the CV (Capacitance Voltage) technique. It is apparent that when the silicon nitride film 11 has a thickness of 20 nm, the energy level $E_F-E_i=0$ to 0.2 eV or the interface trap density near the conduction band is increased. When the thickness of the silicon nitride film is 7 nm, on the other hand, the conduction band is not increased. In the above equation, $E_F$ represents the energy level of the Fermi state, and $E_i$ represents the reference value of the energy level of semiconductors or the energy level of the center of the forbidden band of single crystalline silicon.

Figure 7:
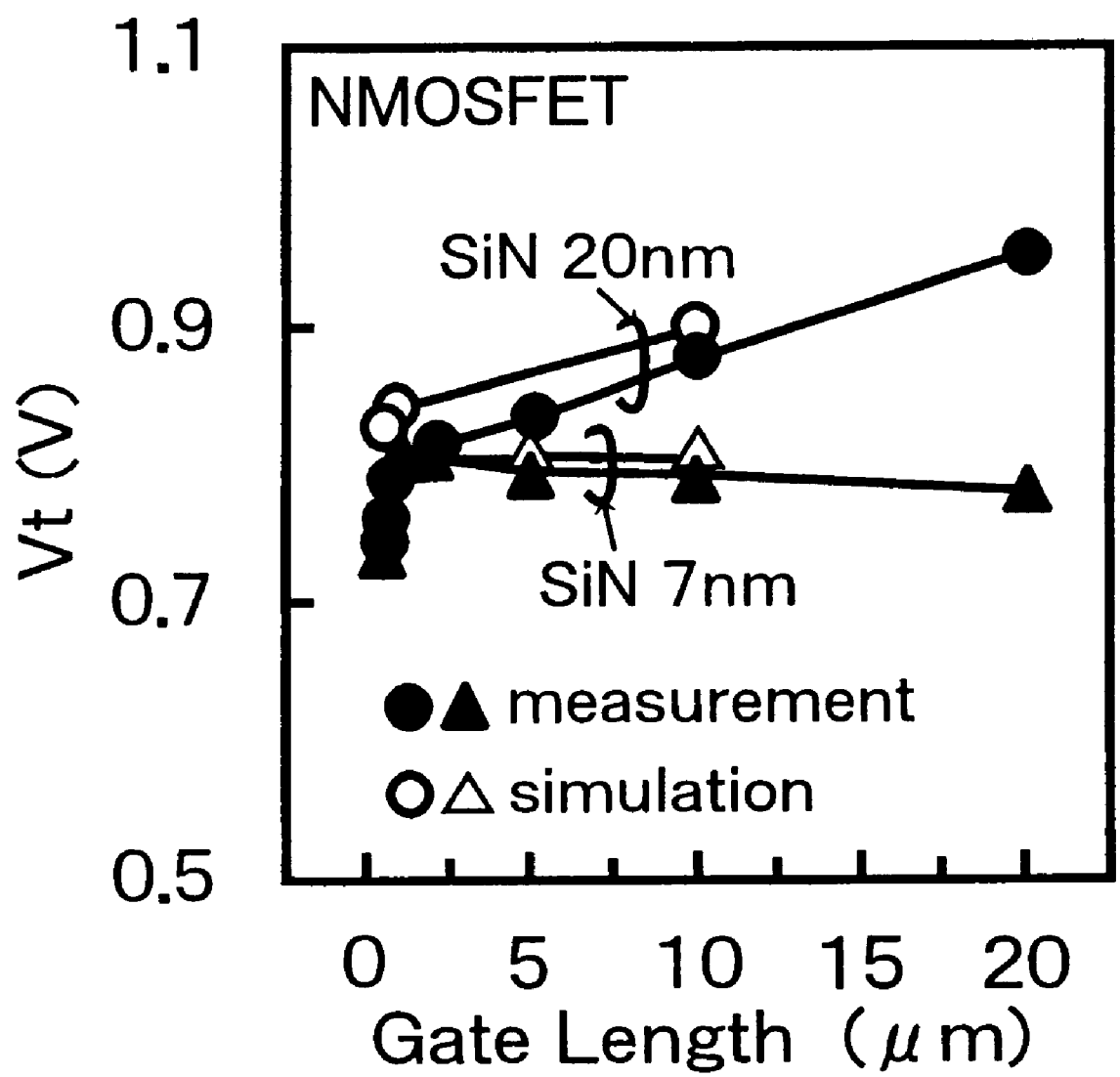
FIG. 7 is a graph showing the comparison results of the simulation on the initial short-channel effect of an NMOSFET using a two-dimensional device simulator.

FIG. 7 shows the results of simulation on the initial short-channel effect of the NMOSFET 9 using a two-dimensional device simulator. Simulation was conducted on the assumption that the increase in the interface trap density in the NMOSFET 9 would have been caused by the production of the acceptor type interface state. It is apparent that the actual measurements shown in FIG. 4 substantially match with the simulated values.

From FIGS. 3 to 7, we understand the following.

When the silicon nitride film 11 is deposited 10 nm thick or thicker, the initial threshold voltage of the NMOSFET 9 increases in the long channel region due to the production of the acceptor type interface state. One possible cause for this interface state is the influence of the mechanical stress caused by the silicon nitride film 11. As the silicon nitride film 11 has a great stress, a mechanical stress is applied to the NMOSFET 9, thus reducing the bonding strength of the Si—O bond near the interface between the substrate 1 and the gate oxide film 3. This forms a trap, which produces the acceptor type interface state.

Since the silicon nitride film 11 has a low permeability against not only water or a hydroxyl group but also hydrogen, it may reduce the amount of terminated hydrogen of the dangling bond to adversely affect the initial short-channel effect characteristics.

As the silicon nitride film 11 is made thinner to 7 nm, an increase in the threshold voltage of the NMOSFET 9 is not seen. It seems that making the silicon nitride film 11 thinner reduces its stress, thus reducing the mechanical stress. It also appears that if the silicon nitride film 11 is made thinner, the permeability of hydrogen is increased, thus increasing the amount of terminated hydrogen of dangling bond.

Even when the silicon nitride film 11 is made as thin as 7 nm, there is no shift seen in the threshold voltage of the PMOSFET 24 by the BT stress.

According to this embodiment, as apparent from the above, each FET 9 or 24 is covered with the silicon nitride film 11 which is formed by LPCVD and the thickness of the silicon nitride film 11 is set to less than 10 nm. This can reduce the deterioration of the reliability of each FET 9 or 24 originating from water or a hydroxyl group, making it possible to prevent the silicon nitride film 11 from influencing the initial characteristics of each FET 9 or 24.

The proper range for the thickness of the silicon nitride film 11 is suitably less than 10 nm as mentioned above, preferably greater than 3 nm but less than 10 nm, and most preferably greater than 3 nm but less than 5 nm. When the thickness of the silicon nitride film 11 becomes less than 3 nm, it may affect the deterioration of the reliability of the PMOSFET 24, while it does not cause such deterioration on the NMOSFET 9. When the thickness of the silicon nitride film 11 becomes equal to or greater than 10 nm, it may affect the initial characteristics of the NMOSFET 9, while it does not have such an influence on the PMOSFET 24.

The second embodiment of the present invention as adapted to an NMOSFET will now be discussed with reference to the accompanying drawings. To avoid a redundant description, like or same reference numerals are given to those constituents of the second embodiment that are like or the same as the corresponding components of the first embodiment.

Figure 8:
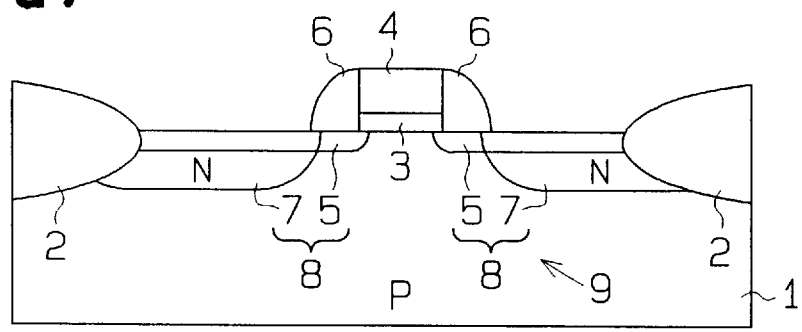
FIGS. 8(a) through 8(c) and FIGS. 9(a) through 9(c) are schematic cross-sectional views for explaining the fabricating steps of the second embodiment.
Figure 8:
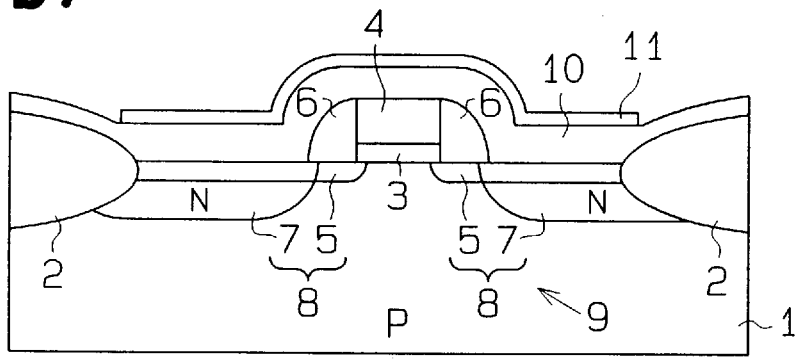
Figure 8:
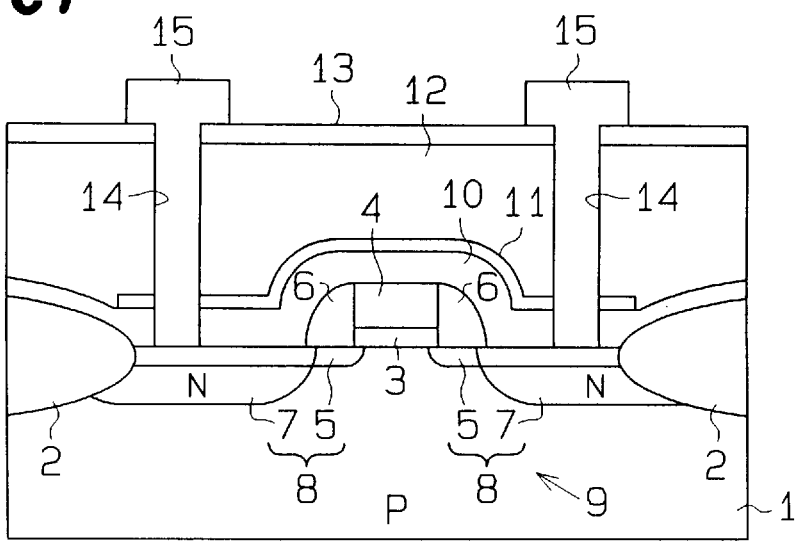
Figure 9:
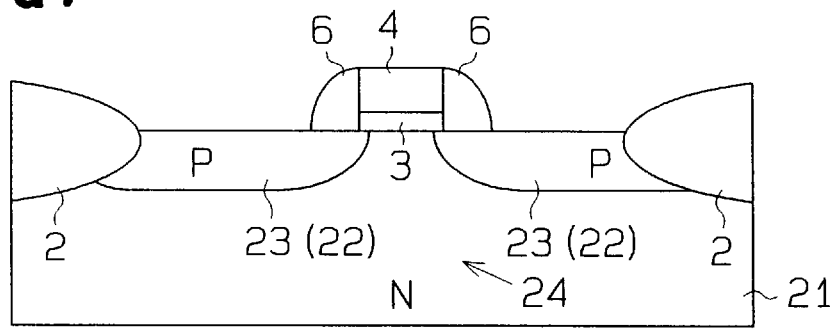
Figure 9:
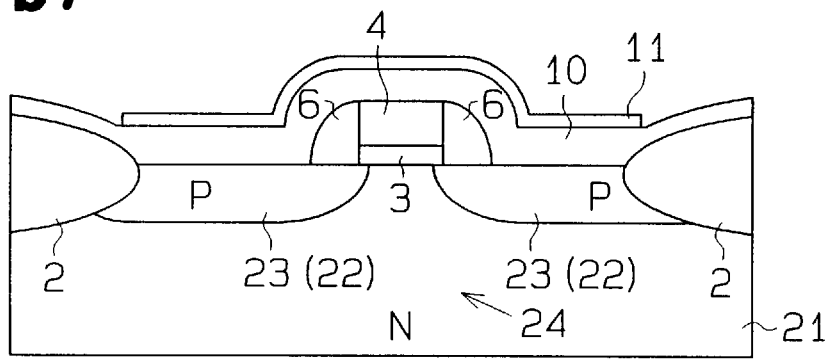
Figure 9:
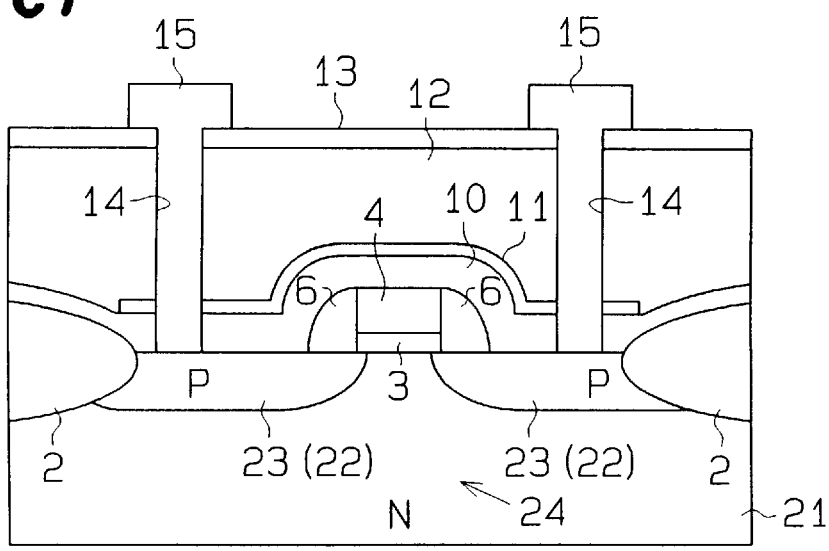

FIGS. 8(*a*) through 8(*c*) illustrate the steps of the fabrication of an NMOSFET according to the second embodiment. FIGS. 9(*a*) through 9(*c*) illustrate the fabrication steps for a PMOSFET according to the second embodiment.

Figure 2:
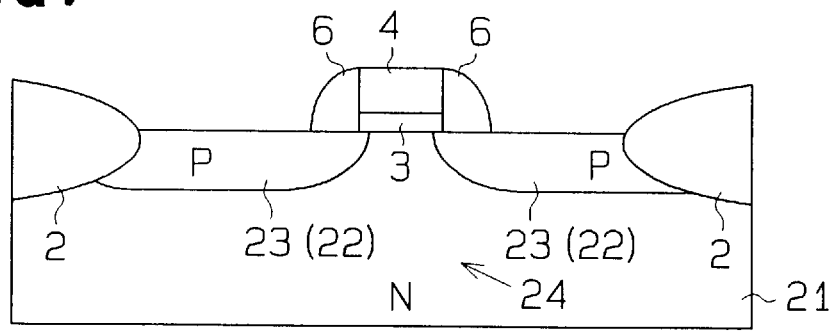
Figure 2:
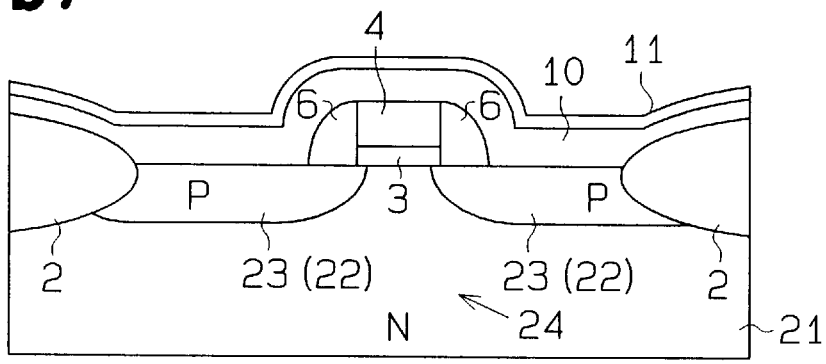
Figure 2:
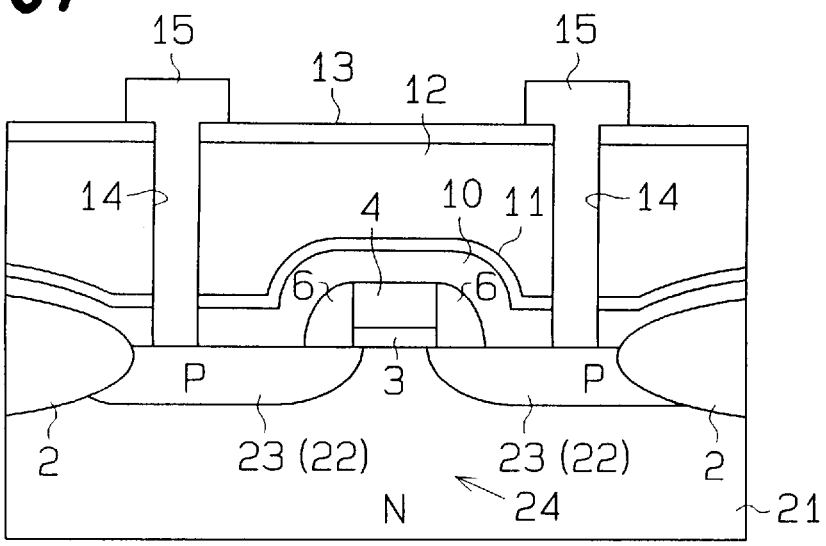

The MOSFETs shown in FIGS. 8 and 9 differ from those of the first embodiment shown in FIGS. 1 and 2 in that the silicon nitride film 11 in the form of lands is formed only on each FET 9 or 24, i.e., on the active region. Specifically, after the silicon nitride film 11 is formed on the entire surface of the device, it is patterned to the desired shape using an ordinary photolithography technique. Since even this step still allows the silicon nitride film 11 to be able to cover the FET 9 or 24, the same function and advantages of the first embodiment can be acquired.

According to this embodiment, there is no particular restriction on the thickness of the silicon nitride film 11, and it may be set equal to or greater than 10 nm. The present inventors confirmed that the above-described advantages were obtained even when the thickness of the silicon nitride film 11 was set to 30 nm.

This is because forming the land-shaped silicon nitride film 11 on each FET 9 or 24 reduces the area of the silicon nitride film 11, thus reducing its stress. Further, hydrogen, which has a higher diffusion coefficient than water or a hydroxyl group, goes around the end portions of the silicon nitride film 11 and penetrates under the gate electrode 4 from there. As a result, the number of dangling bonds decreases because of hydrogen terminations.

Even if the land-shaped silicon nitride film 11 is formed in such a manner that part of the silicon nitride film 11 covers not only the surface of each FET 9 or 24, i.e., the active region, but also the end portions of the device isolating insulator film 2, the same function and advantages as discussed above can still be acquired.

Figure 10:
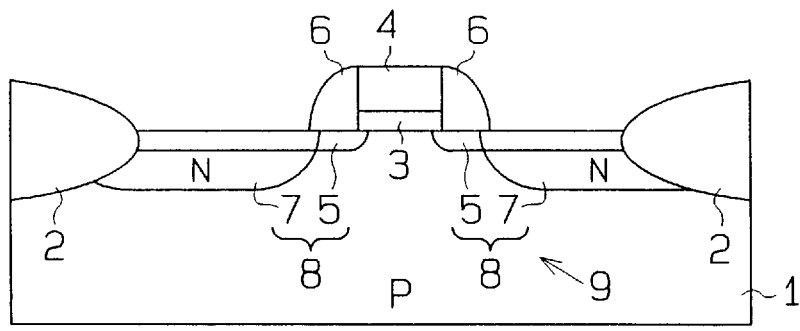
FIGS. 10(a) through 10(c) and FIGS. 11(a) through 11(c) are schematic cross-sectional views for explaining the fabricating steps of the third embodiment.
Figure 10:
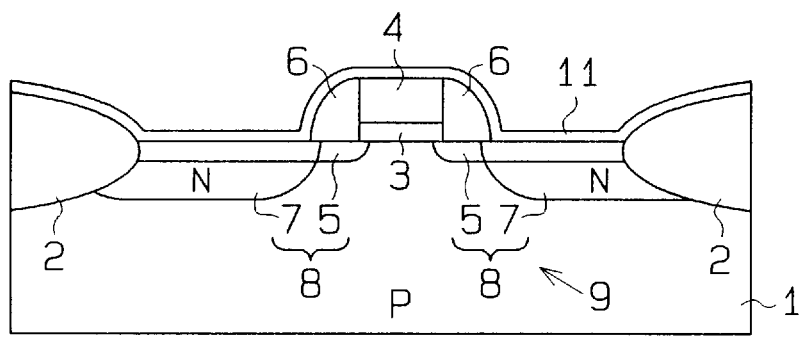
Figure 10:
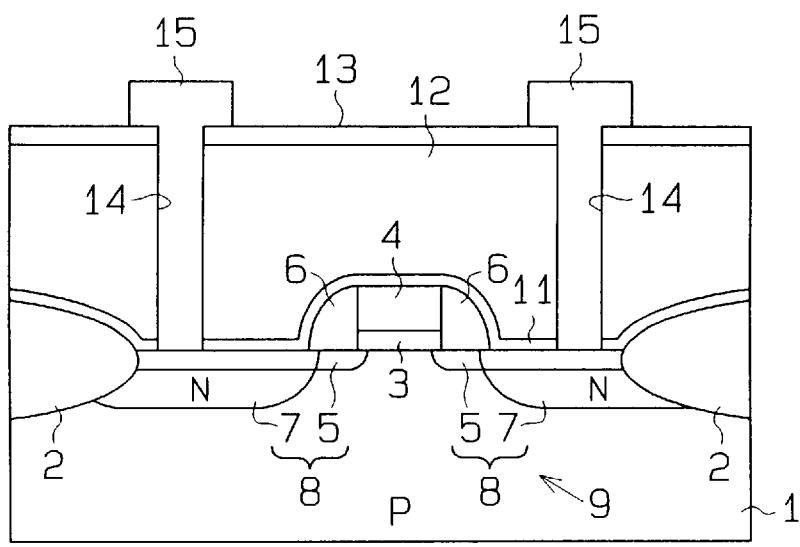
Figure 11:
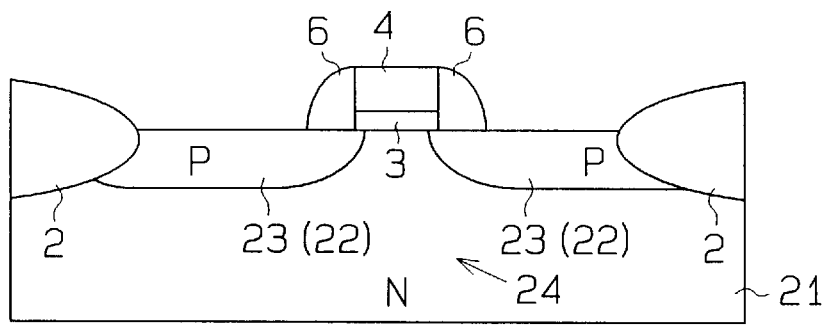
Figure 11:
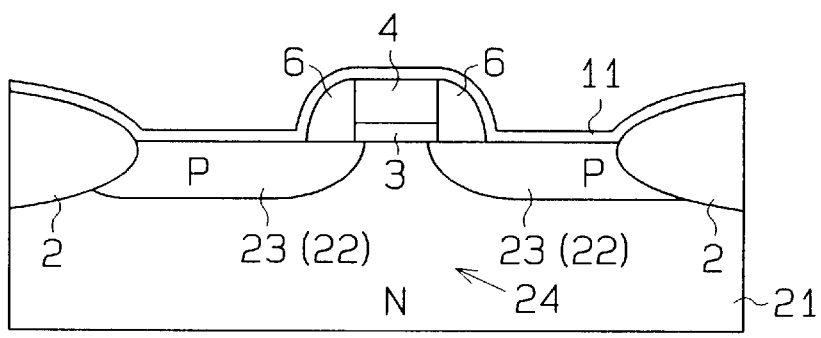
Figure 11:
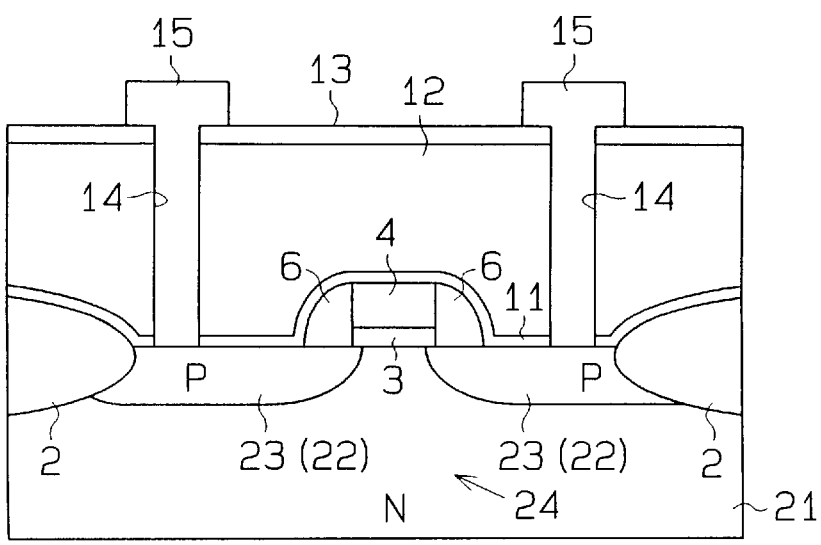

FIGS. 10(*a*) through 10(*c*) illustrate the steps of the fabrication of an NMOSFET according to the third embodiment. FIGS. 11(*a*) through 11(*c*) likewise illustrate the fabrication steps for a PMOSFET according to the third embodiment. To avoid a redundant description, like or same reference numerals are given to those constituents of the third embodiment that are like or the same as the corresponding components of the first embodiment.

The MOSFETs shown in FIGS. 10 and 11 differ from those of the first embodiment shown in FIGS. 1 and 2 in that the TEOS film 10 is eliminated and the silicon nitride film 11 is formed directly on the source/drain region 8 or 23, the gate electrode 4 and the side wall spacers 6. Because even this difference still allows the silicon nitride film 11 to be able to cover the FET 9 or 24, the same function and advantages of the first embodiment can still be acquired.

Figure 12:
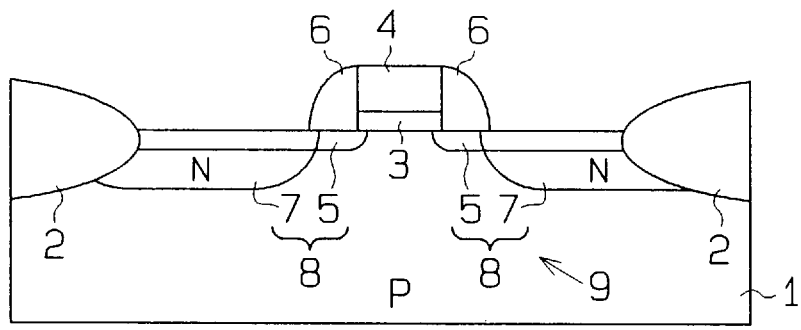
FIGS. 12(a) through 12(c) and FIGS. 13(a) through 13(c) are schematic cross-sectional views for explaining the fabricating steps of the fourth embodiment.
Figure 12:
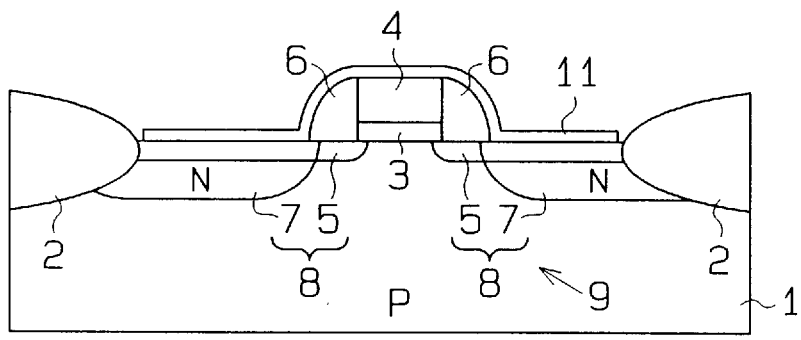
Figure 12:
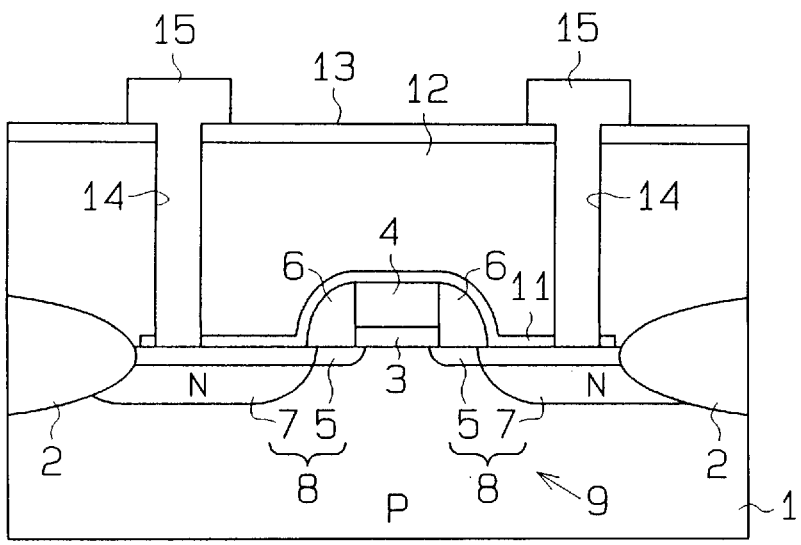
Figure 13:
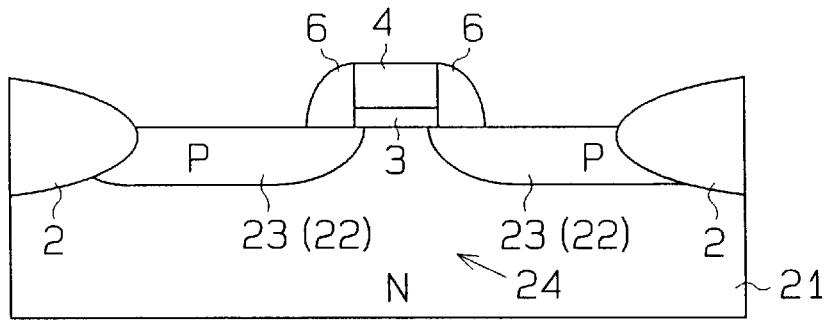
Figure 13:
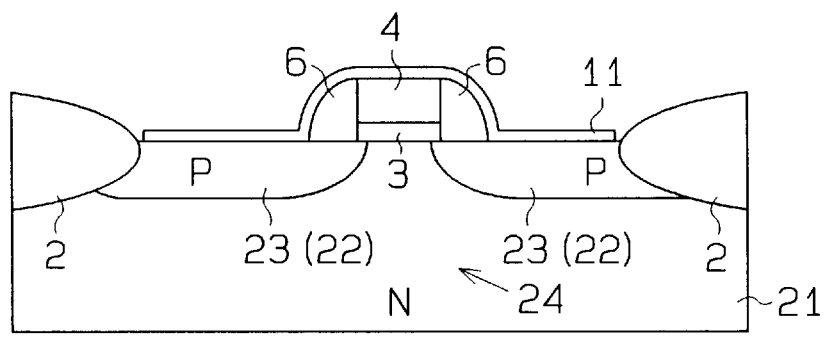
Figure 13:
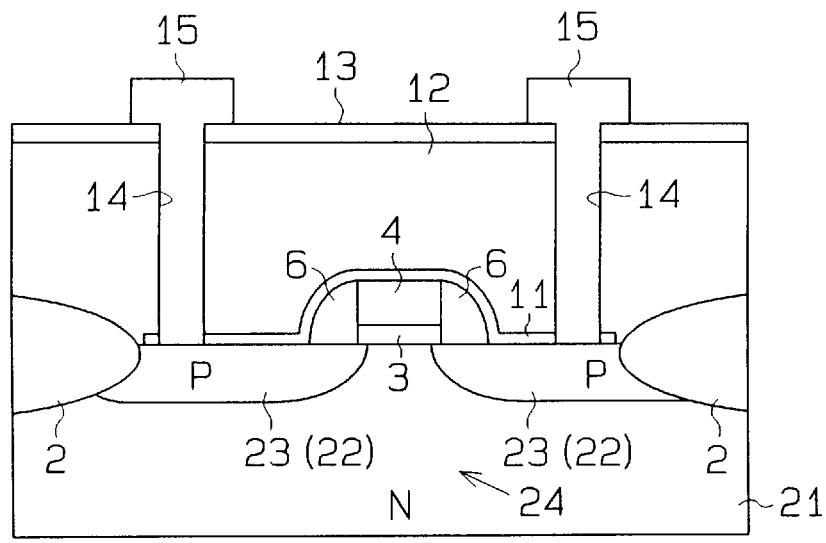

FIGS. 12(*a*) through 12(*c*) illustrate the steps of the fabrication of an NMOSFET according to the fourth embodiment. FIGS. 13(a) through 13(c) likewise illustrate the fabrication steps for a PMOSFET according to the fourth embodiment. The fourth embodiment is a combination of the second and third embodiments.

According to this embodiment, like the second embodiment, the land-shaped silicon nitride film 11 is formed only on each FET 9 or 24, i.e., on the active region.

Further, in this embodiment like the third embodiment, the TEOS film 10 is eliminated and the silicon nitride film 11 is formed directly on the source/drain region 8 or 23, the gate electrode 4 and the side wall spacers 6. This design can provide the same function and advantages of the second and third embodiments. There is no particular restriction on the thickness of the silicon nitride film 11 in this embodiment, and it may be set equal to or greater than 10 nm.

The fifth embodiment of this invention will now be described with reference to the accompanying drawings. To avoid the redundant description, like or same reference numerals are given to those constituents of the fifth embodiment that are like or the same as the corresponding components of the fourth embodiment.

Figure 14:
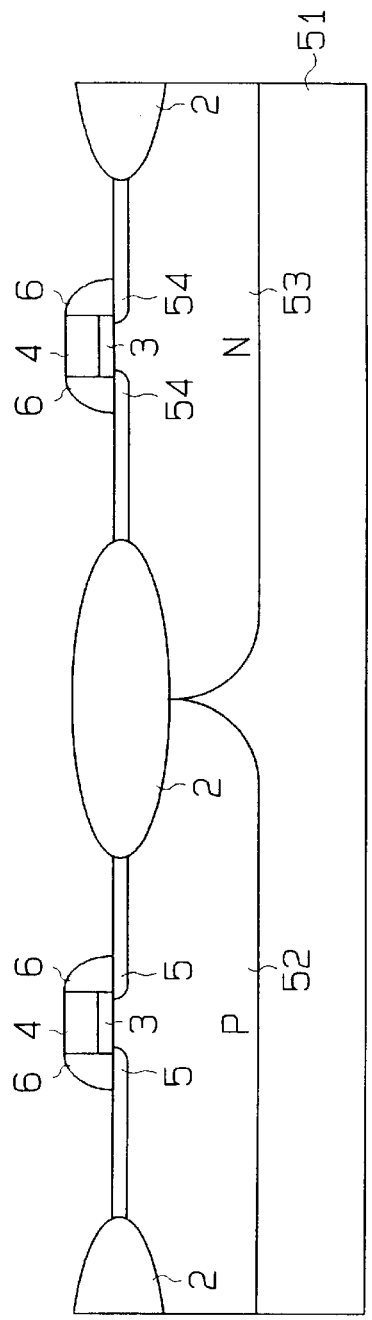
Figure 14:
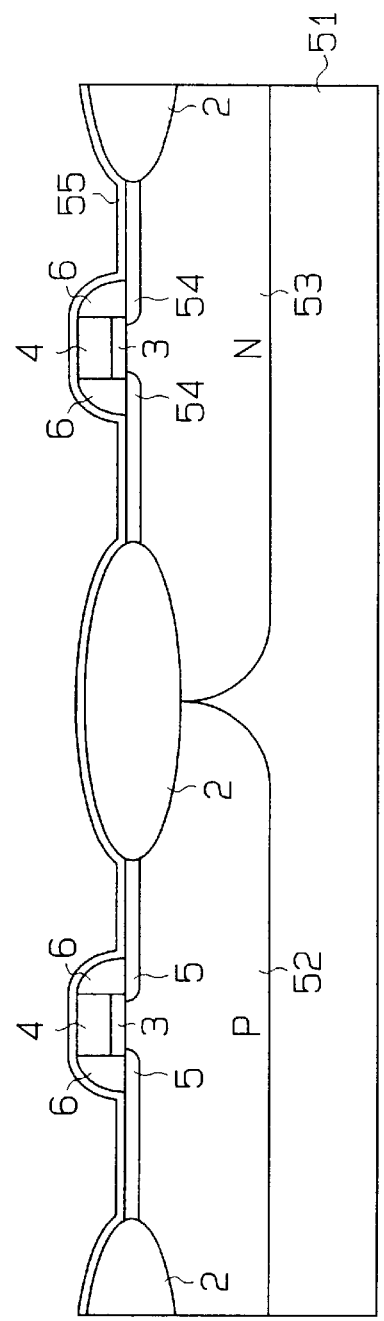

In step 1 (see FIG. 14(a)), a P type impurity is doped into a single crystalline silicon substrate 51 to form a P well 52. Further, an N type impurity is doped into the substrate 51 to form an N well 53. Next, a device isolating insulator film 2 is formed on the wells 52 and 53 by LOCOS. As a result, the surfaces of the wells 52 and 53 that are exposed through the device isolating insulator film serve as 0 active regions.

Next, a gate oxide film 3 is formed on the well 52 and 53 by thermal oxidation. Subsequently, a doped polysilicon film added with an N type impurity is formed on the gate oxide film 3, and is then patterned to form gate electrodes 4. After the N well 53 is covered with a resist pattern (not shown), phosphor ions are injected into the surface of the P well 52 using the gate electrode 4 on the P well 52 as an ion injection mask, thereby forming a low-concentration N type impurity region 5 on the P well 52.

Subsequently, the P well 52 is covered with a resist pattern (not shown) after which ions of boron fluoride are injected into the surface of the N well 53 using the gate electrode 4 on the N well 53 as an ion injection mask, thereby forming a low-concentration P type impurity region 54 on the N well 53. Next, a silicon oxide film is formed on the entire surface of the device, acquired through the above step, by CVD. This silicon oxide film is etched back using the full surface etch-back, thus forming side wall spacers 6 on both sides of each gate electrode 4.

In step 2 (see FIG. 14(b)), a silicon nitride film 55 (thickness: 20 nm) is formed on the entire surface of the resultant device obtained through the above step. A material gas used is a ($SiH_2Cl_2+NH_3$)-based gas, and the film forming temperature is 700 to 900° C.

In step 3 (see FIG. 15(a)), a resist pattern 56 is formed so as to cover the end portion of the device insulator film 2, which surrounds the N well 53, and the N well 53. Next, the P well 52 and the silicon nitride film 55 on the device isolating insulator film 2, which surrounds the P well 52, are patterned and removed by dry etching (etching gas: $CF_4+H_2$) using the resist pattern 56 as an etching mask.

Subsequently, arsenic ions are injected into the surface of the P well 52 using the resist pattern 56 as an ion injection mask, thus forming a high-concentration N type impurity region 7 on the P well 52. Consequently, a silicon gate NMOSFET 9 having an LDD structure, which has a source/drain region 8 comprised of the low-concentration impurity region 5 and the high-concentration impurity region 7, is formed.

In step 4 (see FIG. 15(b)), a silicon oxide film 57 (thickness: 10 nm) is formed, by LPCVD, on the entire surface of the resultant device obtained through the above step. Next, a silicon nitride film 58 (thickness: 20 nm) is formed on the silicon oxide film 57 under the same film forming conditions used for the silicon nitride film 55. Then, a resist pattern 59 is formed so as to cover the end portion of the device isolating insulator film 2, which surrounds the P well 52 and the N well 53.

In step 5 (see FIG. 16(a)), the N well 53 and the silicon nitride film 58 on the device isolating insulator film 2, which surrounds the N well 53, are patterned and removed by dry etching (etching gas: $CF_4+H_2$) using the resist pattern 59 as an etching mask. Subsequently, the ions of boron fluoride are injected in the surface of the N well 53 using the resist pattern 59 as an ion injection mask, thus forming a high-concentration P type impurity region 60 on the N well 53. Then, annealing is performed to activate the individual impurity regions 54 and 60. As a result, a silicon gate PMOSFET 62 having an LDD structure, which has a source/drain region 61 comprised of the low-concentration impurity region 54 and the high-concentration impurity region 60, is formed.

In step 6 (see FIG. 16(b)), using CVD, a BPSG film 12 is formed on the entire surface of the device obtained through the above step. Next, a silicon oxide film 13 is formed on the BPSG film 12 by CVD. Subsequently, a contact hole 14 is formed in the individual films 55, 57, 58, 12 and 13. Then, a metal film is formed on the entire surface of the device including the inner wall of the contact hole 14, and is patterned to form a source/drain electrode 15. As the gates and drains of the FETs 9 and 62 are connected by the source/drain electrode 15, and the source of the PMOSFET 62 is connected to the high-potential power supply while the source of the NMOSFET 9 is connected to the low-potential power supply, a CMOS inverter comprised of the FETs 9 and 62 is completed.

As apparent from the above, this embodiment can provide a the following function and advantages.

The land-shaped silicon nitride film 55 is formed so as to cover the top of the PMOSFET 62, i.e., the active region, and the end portion of the device isolating insulator film 2, which surrounds the N well 53 where PMOSFET 62 is formed. As the PMOSFET 62 is covered with the land-shaped silicon nitride film 55, therefore, the same function and advantages of the fourth embodiment can be acquired.

According to this embodiment, there is no particular restriction on the thickness of the silicon nitride film 55, and it may be set equal to or greater than 10 nm. The present inventors confirmed that the above-described advantages were obtained even when the thickness of the silicon nitride film 55 was set to 30 nm. This is because forming the silicon nitride film 55 in the form of lands reduces the area of the silicon nitride film 55, thus reducing its stress. This reduces the mechanical stress on the PMOSFET 62. Further, hydrogen, which has a higher diffusion coefficient than water or a hydroxyl group, goes around the end portions of the silicon nitride film 55 and penetrates under the gate electrode 4 from there. As a result, the number of dangling bonds with hydrogen ends increases.

The land-shaped silicon nitride film 58 is formed so as to cover the top of the NMOSFET 9, i.e., the active region, and the end portion of the device isolating insulator film 2, which surrounds the P well 52 where NMOSFET 9 is formed. As the NMOSFET 9 is covered with the land-shaped silicon nitride film 58, therefore, the same function and advantages of the fourth embodiment can be acquired.

The thickness of the silicon nitride film 58 of the NMOSFET 9 in FIG. 16(b), like that of the PMOSFET 62, may be set equal to or greater than 10 nm, e.g., 30 nm. The reason for this is the same as that given for the PMOSFET 62. In this embodiment, there is no particular restriction on the thickness of the silicon oxide film 57, which may be set equal to or greater than 10 nm.

In the above-discussed step 3, after the silicon nitride film 55 is patterned into lands using the resist pattern 56 as an etching mask, the high-concentration N type impurity region 7 of the NMOSFET 9 is formed using the resist pattern 56 as an ion injection mask. That is, the resist pattern 56, which serves as an ion injection mask to form the high-concentration N type impurity region 7 of the NMOSFET 9, is also used as an etching mask to pattern the silicon nitride film 55 into lands. At the time of patterning the silicon nitride film 55 into lands, therefore, an additional photolithography technique is unnecessary, thus preventing the fabrication steps from becoming complicated.

In the above-discussed steps 4 and 5, after the silicon nitride film 58 is patterned into lands using the resist pattern 59 as an etching mask, the high-concentration P type impurity region 60 of the PMOSFET 62 is formed using the resist pattern 59 as an ion injection mask. That is, the resist pattern 59, which serves as an ion injection mask to form the high-concentration P type impurity region 60 of the PMOSFET 62, is also used as an etching mask to pattern the silicon nitride film 58 into lands. At the time of patterning the silicon nitride film 58 into lands, therefore, no additional photolithography technique is needed, thus preventing the fabrication steps from becoming complicated.

The silicon nitride film 58 and the silicon oxide film 57 have significantly different etching rates. At the time of patterning the silicon nitride film 58 in step 5, therefore, the silicon oxide film 57 serves as an etching stopper. It therefore becomes possible to prevent the removal of the N well 53 and the silicon nitride film 55 on the device isolating insulator film 2, which surrounds the N well 53, and to surely increase the number of dangling bonds with hydrogen ends.

The sixth embodiment of this invention will now be described with reference to the accompanying drawings. To avoid a redundant description, like or same reference numerals are given to those constituents of this embodiment that are like or the same as the corresponding components of the fifth embodiment.

Step 1 (see FIG. 14(a)) and step 2 (FIG. 14(b)) are the same as those of the fifth embodiment.

In step 3 (see FIG. 17(a)), a resist pattern 59 is formed so as to cover the end portion of a device isolating insulator film 2, which surrounds a P well 52, and the P well 52. Next, an N well 53 and a silicon nitride film 55 on the device isolating insulator film 2, which surrounds the N well 53, are patterned and removed by using the resist pattern 59 as an etching mask. Subsequently, the ions of boron fluoride are injected in the surface of the N well 53 using the resist pattern 59 as an ion injection mask, thus forming a high-concentration P type impurity region 60 on the N well 53. Then, annealing is performed to activate the individual impurity regions 54 and 60 to thereby form a PMOSFET 62.

In step 4 (see FIG. 17(b)), a silicon oxide film 57 and a silicon nitride film 58 are sequentially formed on the entire surface of the resultant device obtained through the above step. Next, a resist pattern 56 is formed so as to cover the end portion of the device isolating insulator film 2, which surrounds the N well 53, and the N well 53.

In step 5 (see FIG. 18(a)), the P well 52 and the silicon nitride film 58 on the device isolating insulator film 2, which surrounds the P well 52, are patterned and removed by using the resist pattern 56 as an etching mask. Subsequently, arsenic ions are injected in the surface of the P well 52 using the resist pattern 56 as an ion injection mask, thus forming a high-concentration N type impurity region 7 on the P well 52. Then, annealing is performed to activate the individual impurity regions 5 and 7, thereby forming an NMOSFET 9. Step 6 (FIG. 18(b)) is the same as step 6 of the fifth embodiment.

As apparent from the above, this embodiment can provide the following function and advantages.

The NMOSFET 62 is formed after the formation of the PMOSFET 9 in the fifth embodiment, whereas the PMOSFET 9 is formed after the formation of the NMOSFET 62 in this embodiment.

According to this embodiment, the land-shaped silicon nitride film 58 is formed so as to cover the top of the PMOSFET 62 and the end portion of the device isolating insulator film 2, which surrounds the N well 53 where PMOSFET 62 is formed. Further, the land-shaped silicon nitride film 55 is formed so as to cover the top of the NMOSFET 9 and the end portion of the device isolating insulator film 2, which surrounds the P well 52, where the NMOSFET 9 is formed. The PMOSFET 62 is covered with the land-shaped silicon nitride film 58 and the NMOSFET 9 is covered with the land-shaped silicon nitride film 55. This embodiment can therefore provide the same function and advantages as can be provided by the fifth embodiment.

The above-described embodiments may be modified as follows with the function and advantages unchanged.

At the time the silicon nitride film 11, 55 or 58 is formed by LPCVD, the silicon nitride film 11, 55 or 58 is also formed on the entire back surface of the substrate 1, 21 or 51. If the silicon nitride film 11, 55 or 58 is left on the entire back surface, it is possible to prevent the permeation of water or a hydroxyl group from the back of the substrate 1, 21 or 51. This can further enhance the effects of th e individual embodiments.

The TEOS film 10 formed by LPCVD may be replaced with another insulator film, which contains a lower amount of water or a hydroxyl group and has a low permeability against water or a hydroxyl group, such as a silicon oxide film formed by LPCVD, plasma CVD or ECR plasma CVD.

The BPSG film 12 may be replaced with another insulator film having an excellent flatness, such as an SOG (Spin On Glass) film or a TEOS film formed by ozone CVD.

The NMOSFET 9 m ay be designed to have an SD structure, not an LDD structure. Likewise, the PMOSFET 62 may be d esign ed to have an SD structure, not an LDD structure.

The silicon oxide film 57 may be replaced with any other pr oper film of which the etching rate differs from that of a silicon nitride film.

This invention may be adapted not only to a silicon gate MOSFET (9, 24 or 62), but also to general MIS (Metal Insulator Semiconductor) FETs. Specifically, the gate oxide film 3 may be replaced with another prop er insulator film, such as a silicon nitride film or a film having a lamination structure of a silicon nitride film and a silicon oxide film.

This invention may be adapted not only to a silicon gate MOSFET (9, 24 or 62), but also to general insulated gate FETs (IGFETS). Specifically, the gate electrode 4 may be formed of a proper conductive material other than doped polysilicon, such as various kinds of metals like aluminum and high-melting point metals or metal silicide.

It is to be noted that the constituent members of this invention are defined as follows in this specification. The "semiconductor substrate" should include not only a single crystalline silicon substrate, but also a well, a polycrystalline silicon thin film, an amorphous silicon thin film and an SOI (Silicon On Insulator) substrate. The "insulated gate FET (IGFET)" should include not only an MOSFET, but also an MIS (Metal Insulator Silicon) FET, silicon gate MOSFET, silicide gate MOSFET and silicon MOSFET.

What is claimed is:

1. A semiconductor device comprising:
   a semiconductor substrate;
   a transistor device formed on the semiconductor substrate; and
   a silicon nitride film having a thickness greater than 3 nm and less than 5 nm and covering the transistor device.

2. The semiconductor device according to claim 1 further comprising an insulator film defining an active region on the semiconductor substrate, wherein the transistor device is formed on the active region, and wherein the silicon nitride film covers at least the active region.

3. The semiconductor device according to claim 2, wherein the transistor device is an insulated gate field effect transistor (insulated gate FET).

4. The semiconductor device according to claim 3, wherein the insulated gate FET includes a source/drain region and a gate oxide film formed within the active region and a gate electrode formed on the gate oxide film, and wherein the silicon nitride film covers at least the gate oxide film and the gate electrode.

5. The semiconductor device according to claim 1, wherein the transistor device is a silicon gate field effect transistor (silicon gate FET).

6. The semiconductor device according to claim 1, wherein the transistor device is a silicon metal oxide field effect transistor (silicon MOSFET).

7. A semiconductor device comprising:
   a semiconductor substrate;
   a pair of source/drain regions formed at a predetermined interval on the semiconductor substrate;
   a gate insulator film formed between the source/drain regions of the pair on the semiconductor substrate;
   a gate electrode formed on the gate insulator film; and
   a film covering the gate electrode and the source/drain regions, the film having a low permeability against water and a hydroxyl group and having a thickness greater than 3 nm and less than 5 nm.

8. The semiconductor device according to claim 7, wherein the film is a silicon nitride film formed by low pressure chemical vapor deposition (LPCVD).

9. The semiconductor device according to claim 8 further comprising a tetraethyl ortho-silicate film formed between the gate electrode and the silicon nitride film and between the source/drain regions and the silicon nitride film.

10. The semiconductor device according to claim 9, wherein the gate electrode and the gate insulator film have side walls covered with associated side wall spacers.

11. The semiconductor device according to claim 8, wherein the semiconductor substrate has a device isolating insulator film that defines an active region corresponding to one transistor device, wherein the pairs of source/drain regions are formed within the active region.

12. The semiconductor device according to claim 11, wherein the silicon nitride film covers at least part of the device isolating insulator film.

13. A semiconductor device comprising:
    a semiconductor substrate;
    a first conductive well and a second conductive well formed on the semiconductor substrate;
    a device isolating insulator film formed on the semiconductor substrate for defining a first active region associated with the first conductive well and a second active region associated with the second conductive well;
    a pair of gate insulator films respectively formed on the first conductive well and the second conductive well within the associated first and second active regions;
    a gate electrode formed on each gate insulator film;
    a pair of source/drain regions formed within the associated first and second active regions and located on the opposite sides of each gate electrode; and
    a silicon nitride film covering each gate electrode and the source/drain regions and having a thickness greater than 3 nm and less than 5 nm.

14. The semiconductor device according to claim 13, wherein the silicon nitride film covers part of the device isolating insulator film.

15. The semiconductor device according to claim 14, wherein the first conductive well is a P type well and the second conductive well is an N type well.

16. The semiconductor device according to claim 15 further comprising a first silicon oxide film that covers the silicon nitride film associated with the first active region.

17. The semiconductor device according to claim 16 further comprising a second silicon oxide film interposed between the silicon nitride film and the source/drain regions associated with the second active region.

18. The semiconductor device according to claim 17, wherein the first and second silicon oxides are connected with each other on the device isolating insulator film.

19. The semiconductor device according to claim 1, further comprising a Boro-Phospho Silicate Glass film covering the silicon nitride film.

20. The semiconductor device according to claim 1, further comprising a substantially flat film covering the silicon nitride film.

21. The semiconductor device according to claim 1, further comprising a film covering the silicon nitride film which is a supply of water or a hydroxyl group.

22. The semiconductor device according to claim 1, wherein the silicon nitride film is applied by chemical vapor deposition.

23. The semiconductor device according to claim 1, wherein at least one film covers the silicon nitride film.

24. The semiconductor device according to claim 1, wherein the silicon nitride film is above at least a source, a drain and one or more gates of the transistor device.

25. The semiconductor device according to claim 1, wherein the semiconductor substrate is a single crystal semiconductor.

* * * * *